United States Patent
Oberlaender et al.

(10) Patent No.: US 6,512,716 B2
(45) Date of Patent: Jan. 28, 2003

(54) MEMORY DEVICE WITH SUPPORT FOR UNALIGNED ACCESS

(75) Inventors: Klaus Oberlaender, San Jose; Sabeen Randhawa, Mountain View, both of CA (US); Vincent Rezărd, Nice (FR); Rod G. Fleck, Bellevue, WA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/772,497

(22) Filed: Jan. 29, 2001

(65) Prior Publication Data

US 2001/0024398 A1 Sep. 27, 2001

Related U.S. Application Data

(62) Division of application No. 09/507,568, filed on Feb. 18, 2000, now Pat. No. 6,256,253.

(51) Int. Cl.[7] ................................................. G11C 7/00
(52) U.S. Cl. ...................... 365/230.02; 365/230.01; 365/230.03; 365/230.06; 365/189.02
(58) Field of Search .................... 365/189.01, 230.01, 365/189.02, 230.02, 230.03, 230.06

(56) References Cited

U.S. PATENT DOCUMENTS

| | | | |
|---|---|---|---|
| 4,598,388 A | | 7/1986 | Anderson |
| 5,289,413 A | | 2/1994 | Tsuchida et al. |
| 5,819,117 A | * | 10/1998 | Hansen ........................ 395/898 |
| 5,914,953 A | * | 6/1999 | Krause et al. ............... 370/392 |
| 5,973,950 A | | 10/1999 | Shindo ........................... 365/49 |
| 6,021,084 A | | 2/2000 | McLaury ................. 35/230.02 |
| 6,032,170 A | * | 2/2000 | Guttag et al. ................ 708/620 |
| 6,047,352 A | | 4/2000 | Lakhani et al. ................. 711/5 |
| 6,061,291 A | | 5/2000 | Zheng .................... 365/230.06 |
| 6,061,779 A | * | 5/2000 | Garde ........................... 712/204 |
| 6,072,735 A | | 6/2000 | Komoriya et al. ........... 365/200 |
| 6,076,136 A | | 6/2000 | Burroughs et al. |
| 6,118,720 A | * | 9/2000 | Heile ...................... 365/230.01 |
| 6,122,218 A | * | 9/2000 | Kang ..................... 365/230.05 |
| 6,122,219 A | * | 9/2000 | Zheng et al. ........... 365/230.06 |
| 6,130,854 A | * | 10/2000 | Gould et al. ........... 365/230.06 |
| 6,212,629 B1 | * | 4/2001 | McFarland et al. ......... 712/241 |
| 6,256,253 B1 | * | 7/2001 | Oberlaender et al. .. 365/230.02 |
| 6,292,018 B1 | * | 9/2001 | Kean ............................ 326/41 |
| 6,292,021 B1 | * | 9/2001 | Furtek et al. ................. 326/41 |

* cited by examiner

Primary Examiner—Viet Q. Nguyen
(74) Attorney, Agent, or Firm—Fish & Richardson P.C.

(57) ABSTRACT

An integrated memory comprises a plurality of data lines and a plurality of decoders being associated to each data line. Each data line can address a single memory cell or a plurality of memory cells. Also, each data line can be either a word line or a bit line of a memory. Each decoder generates an enable signal upon receiving of its associated address signal. A plurality of multiplexers having two inputs and an output associated to each data line are provided. The enable signal of each decoder is supplied to a first input of the associated multiplexer and to a second input of the multiplexer associated to the next higher addressed data line, and a control input for controlling said multiplexers.

4 Claims, 8 Drawing Sheets

| Address | | Select Logic | | | | Aligner Mux | | | |
|---|---|---|---|---|---|---|---|---|---|
| A2 | A3 | 140 | 240 | 340 | 440 | MUX1 | MUX2 | MUX3 | MUX4 |
| 0 | 0 | 0 | 0 | 0 | 0 | 1 | 2 | 3 | 4 |
| 0 | 1 | 1 | 0 | 0 | 0 | 4 | 1 | 2 | 3 |
| 1 | 0 | 1 | 1 | 0 | 0 | 3 | 4 | 1 | 2 |
| 1 | 1 | 1 | 1 | 1 | 0 | 2 | 3 | 4 | 1 |

MEMORY DEVICE WITH SUPPORT FOR UNALIGNED ACCESS

This is a divisional of application Ser. No. 09/507,568 filed Feb. 18, 2000, now U.S. Pat. No. 6,256,253.

BACKGROUND OF THE INVENTION

The present invention relates to a memory device with support for unaligned access. Such a memory may be incorporated in a microprocessor or microcontroller. In particular, modern microprocessors or microcontrollers provide the capability of loading and storing multiple words in parallel. Therefore, the memory unit is designed to input,and output multiple words. For example, a memory unit has a 128 bit wide bus to read and write four 32-bit words in parallel. In particular, if a memory system is integrated with a microprocessor or microcontroller, for example as a cache sub-system, this allows extremely high data throughput.

Figure 9:
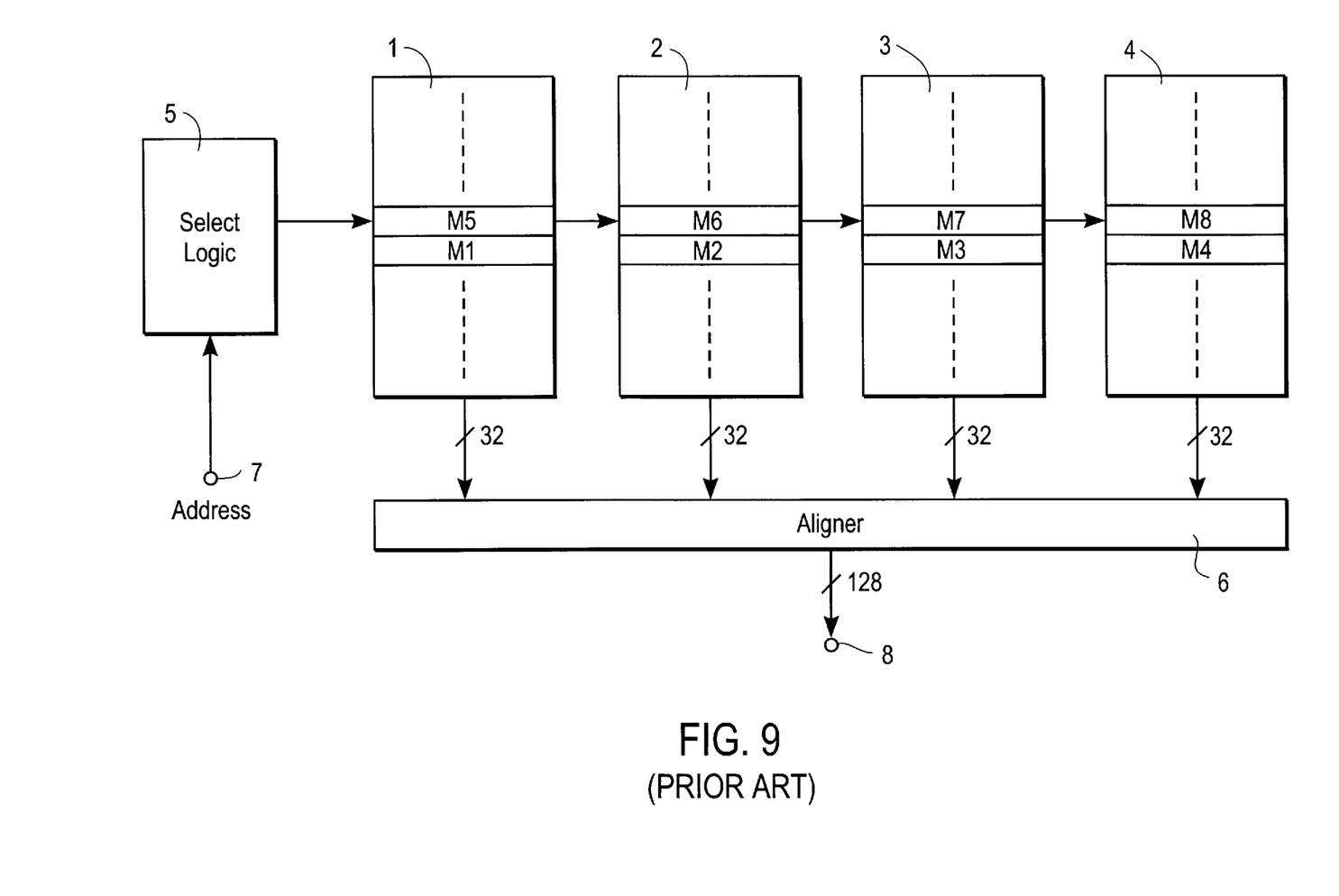
FIG. 9 shows a memory unit according to the prior art.

FIG. 9 shows such an arrangement according to the prior art. The memory unit consists of four memory blocks 1, 2, 3, and 4. Each memory block 1, 2, 3, and 4 provides a 32-bit wide interface which is connected to an alignment unit 6. A select logic unit 5 is provided which receives an address from terminal from a central processing unit (not shown). If an address provided to terminal 7 has a start address within the memory unit which begins at memory block 1, an aligned access to the memory unit takes place. A 128-bit word consisting of the content of memory cells M1, M2, M3, and M4 will be fed to the aligner 6 which connects this output directly to terminal 8. In case of an unaligned access to the memory unit the following scenario takes place. If, for example, an address provided at terminal 7 starts within the memory unit at memory block 3, the 128-Bit word consists of the content of memory cells M3, M4, MS, and M6. Only the first two 32-bit words M3 and M4 can be accessed in a first cycle because the system can only access one memory line during one cycle. In other words, only memory line M1, M2, M3, and M4 or memory line M5, M6, M7, and M8 can be accessed during one cycle. In this example, the requested 128-bit word is distributed over two different memory lines. During a second cycle, the remaining two 32-bit words MS and M6 will be retrieved from memory block 1 and 2 and merged in a register. Aligner 6 multiplexes the output of memory blocks 1, 2, 3, and 4 to output the aligned 128-bit word at terminal 8 in the correct order, namely M3, M4, M5, and M6.

A major disadvantage of this arrangement is the above-described "one cycle penalty" due to the structure of the memory unit in case of an unaligned access as well as a timing disadvantage. Time critical programming can therefore not support any unaligned memory access.

SUMMARY OF THE INVENTION

It is an object of the present invention to provide a memory system which allows unaligned access with a minimal time delay, for example, within a single cycle. This object is achieved by an integrated memory comprising a plurality of data lines and a plurality of decoders being associated to each data line. Each data line can address a single memory cell or a plurality of memory cells. Also, each data line can be either a word line or a bit line of a memory. Each decoder generates an enable signal upon receiving of its associated address signal. A plurality of multiplexers having two inputs and an output associated to each data line are provided. The enable signal of each decoder is supplied to a first input of the associated multiplexer and to a second input of the multiplexer associated to the next higher addressed data line, and a control input for controlling said multiplexers.

In another embodiment a memory system comprises m memory banks.

Each memory bank has an n-bit input/output interface, wherein each of at least m-1 memory banks comprise a plurality of data lines and a plurality of decoders being associated to each data line. Each data line can address a single memory cell or a plurality of memory cells. Also, each data line can be either a word line or a bit line of a memory. Each decoder generates an enable signal upon receiving of its associated address signal. A plurality of multiplexers having two inputs and an output associated to each data line are provided, wherein the enable signal of each decoder is supplied to a first input of the associated multiplexer and to a second input of the multiplexer associated to the next higher addressed data line. A control input for controlling the multiplexers is provided.

In yet another embodiment a memory unit comprises a plurality of word lines and a plurality of bit lines arranged in a matrix, wherein each cross point comprises a memory cell. A plurality of word line decoders having a decoder output associated to each word line and a plurality of multiplexers each comprising two inputs and an output associated with each word line are provided, wherein each multiplexer is coupled with the output of its associated decoder and with the output of the decoder for the next lower addressed word line. The output of the multiplexers controls each associated word line and the multiplexers are controlled by a select signal.

DETAILED DESCRIPTION OF THE INVENTION

Figure 1:
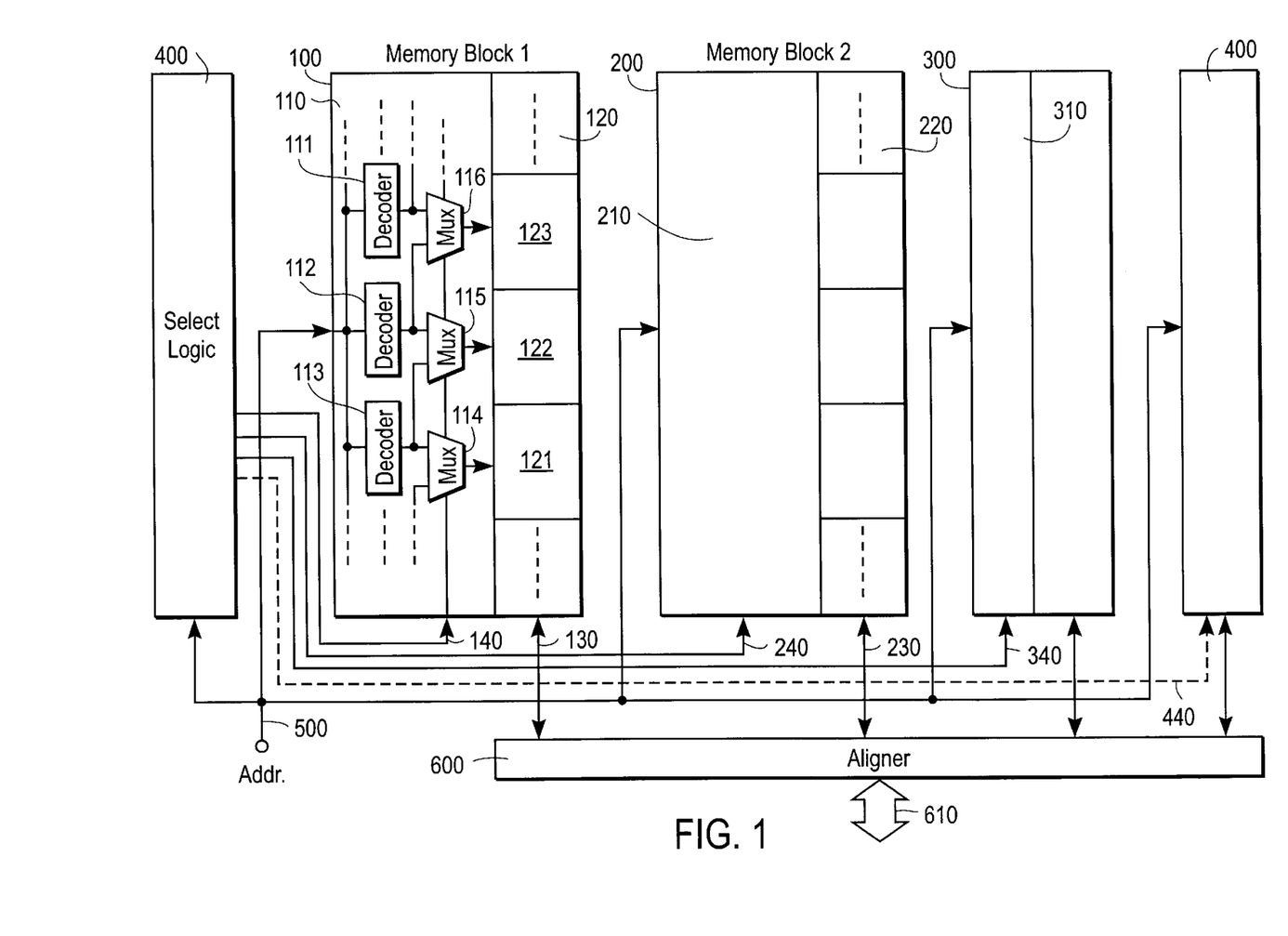
FIG. 1 shows a block diagram of a memory unit according to the present invention.

In FIG. 1, for example, four memory blocks are shown and only details of the first memory block 100 are depicted. Multiple memory blocks are provided to allow input and output of multiple words. In the depicted embodiments it is assumed that four memory blocks 100, 200, 300, and 400 are used, each having a 32-bit interface. Memory blocks 100, 200, and 300 have a similar structure. Only the last memory block 400 can be designed differently as a standard memory block as will be explained later. According to FIG. 1, each memory block 100, 200, 300, and 400 comprises a decoder section 110, 210, 310, 410 and a data line section 120, 220, 320, and 420. Throughout the application, a data line is considered to comprise either a single memory cell or a plurality of memory cells storing a data word. Each decoder section 110 comprises a plurality of decoders 111, 112, 113, . . . Each decoder 111, 112, 113, . . . decodes one data line within a memory block. Furthermore, each decoder 111, 112, 113, . . . receives an address through line 500. A plurality of multiplexers having two inputs and one output is provided in addition for each data line of memory blocks 100, 200, and 300. The output of each decoder is connected with one input of the associated multiplexer and with one input of the multiplexer associated with an address incremented by 1. All multiplexers 114, 115, and 116 of one memory block are controlled by a select signal 140. As memory block 400 can be a standard memory block without the multiplexers, FIG. 1 shows a dotted control line 440 as this control line can be omitted in case of a standard memory block. Select logic unit 400 generates in this embodiment three different select signals 140, 240, and 340 for each memory block 100, 200, 300. To this end, select logic unit 400 receives the necessary address signals from terminal 500, for example, address lines A2 and A3. Each memory block has, for example, a 32-bit wide I/O interface, which connects to an aligner 600. Aligner 600 comprises a plurality of multiplexers to re-arrange the order at its output 610 of the four 32-bit words provided by the four memory blocks 100, 200, 300, and 400 which will be explained in more detail later.

The memory unit described in FIG. 1 allows a unique and very flexible way of addressing memory lines within a memory block. The address provided at terminal 500 defines the start point within the memory from where a 128-bit word has to be loaded or stored. This address is fed to the decoder unit of each memory block 100, 200, 300, and 400. Only those decoders who select the data lines of the start address, reduced by the respective LSB's, will generate an enable signal within each memory block. Thus, usually if the address at terminal 500 is unaligned, in other words does not start in memory block 100, some memory blocks will not select the correct data lines. To this end, a plurality of multiplexers 114, 115, 116 . . . are provided to redirect the select signal generated by the decoders to the next higher data line. Through the address provided at terminal 500 effectively two data lines in each memory block 100, 200, 300, and 400 are addressed. Namely, the data line in which the requested 128-bit word starts and the next data line or in other words the by "1" incremented data line. In a 128-bit wide memory system the physical address increment of "1" reflects in an actual address increment by 32. It is to be understood that throughout the disclosure an incremented data line is selected by means of re-directing the enable signal and not by actually manipulating the provided address. Select logic 400 generates three different select signals 140, 240, 340 for each memory block 100, 200, and 300. Every select signal 140, 240, and 340 controls all respective multiplexers in the decoder section of each memory block 100, 200, 300. Depending on the address 500 either the decoded data line or the data line incremented by "1" is selected. Thus, all data can be retrieved within a single cycle if an unaligned access to the memory is performed.

Figure 2:
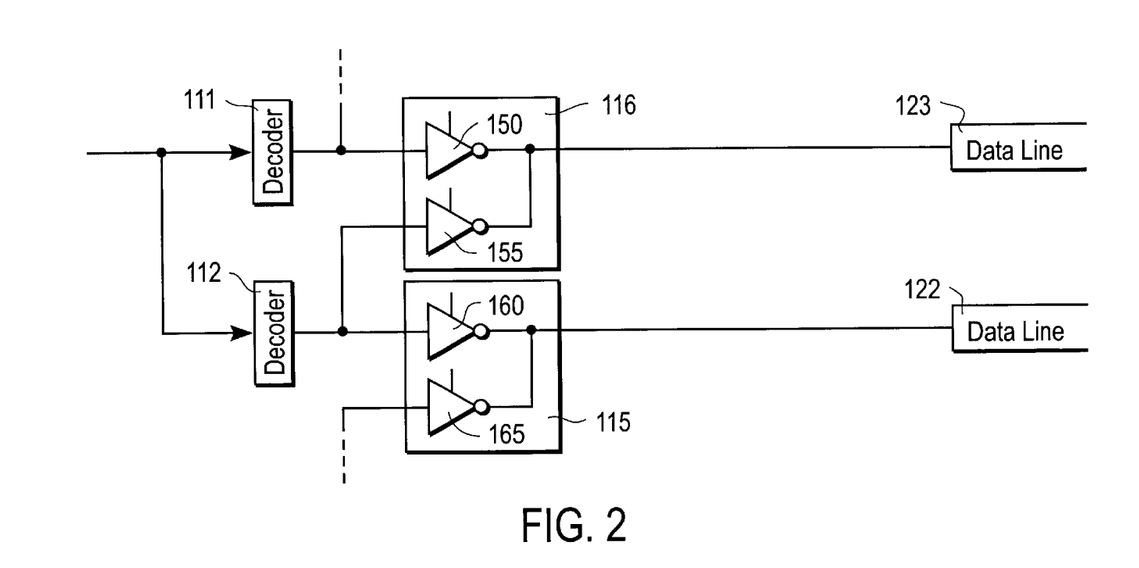
FIG. 2 shows the arrangement of the decoders and multiplexers within a memory block.

FIG. 2 shows an embodiment of the multiplexers 115, 116 of FIG. 1. The output of decoder 111 is coupled with the input of a controllable inverter 150 whose output selects data line 123. The select signal of decoder 112 is coupled with the input of a controllable inverter 155 whose output is coupled with the output of inverter 150. Furthermore, the select signal of decoder 112 is coupled with the input of another controllable inverter 160 whose output selects data line 122. Another controllable inverter 165 is provided whose output is coupled with the output of inverter 160. Controllable inverter 150 and 155 form multiplexer 116 and controllable inverter 160 and 165 form multiplexer 150. Instead of inverters tristate buffers can be used.

Usually, there are drivers and buffers located between the data line decoders and the memory cells. A typical configuration can include an inverter 150 or a tristate buffer. Such an arrangement can be easily extended to form a multiplexer that switches between the select signal from the associated decoder and the select signal from the decoder of the previous data line having an address "−1". To this end, inverter 150 is controllable and a second controllable inverter 155 is provided whose input is coupled with the output of the decoder associated with the data line having an address decremented by "1". Similarly controllable inverter 165 is provided to form multiplexer 115. All other multiplexers are built in the same way. Thus, a minimum of additional silicon area is needed to provide the additional structure according to the present invention. The control inputs of the controllable inverter 150, 155, and 160, 165 can be controlled by complementary signals, respectively. In another embodiment all control inputs of inverters 150, 155, 160, 165, . . . can be controlled by the same control signal. In this case, the control input of inverter 150, 160, . . . has to be designed to act complementary to the control input of inverter 155, 165, . . . If the control signal is set to "0" controllable inverters 150, 160, . . . are activated and controllable inverter 155, 165, . . . will be deactivated. Then, each decoder 111, 112, . . . will control its designated data line, for example, decoder 111 will control data line 123, decoder 112 will control data line 122, etc. If the control signal is set to "1" controllable inverters 150, 160, . . . will be shut off and controllable inverter 155, 165 will be enabled. Thus, decoder 112 will control data line 123 and decoder 11 will control the next higher data line, etc. Thus, if an unaligned access takes place each memory block can be selectively controlled by the select lines 140, 240, 340, and 440 to either address the data line defined by the starting address or the by "1" incremented data line. Memory blocks, which contain the cross over part of the 128-bit word are. therefore switched to the incremented data lines. Therefore, the complete 128-bit word can be output or written in a single cycle with no wait state.

Figure 3A:
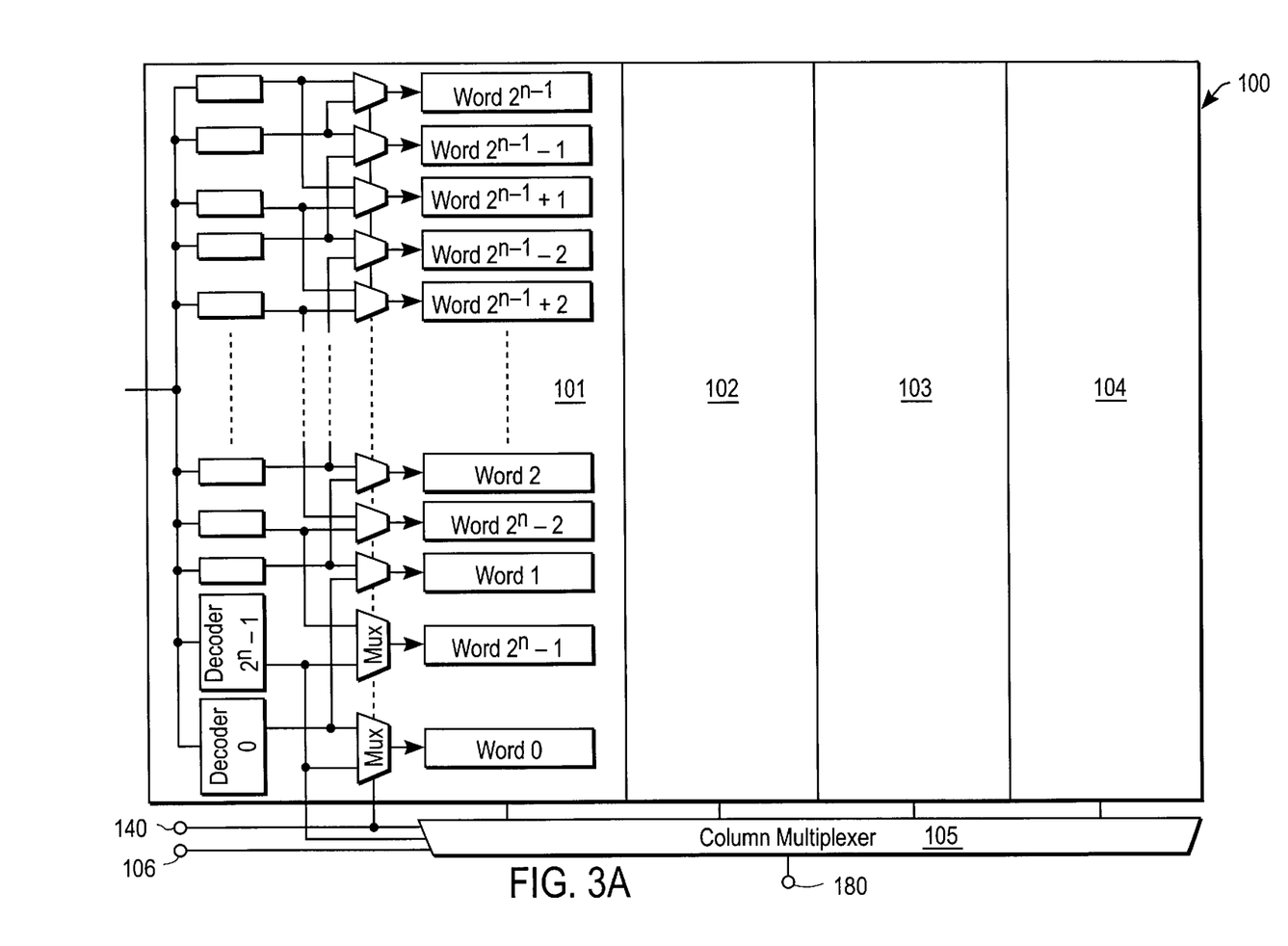
FIG. 3A shows the layout of data lines within a memory block.

FIG. 3A shows an optimized layout of the data lines within a memory block. Memory block 100 can be designed to have 4 internal sub-blocks 101, 102, 103, and 104. A column multiplexer 105 is provided to select the output of each sub-block 101, 102, 103, and 104. In each sub-block 101, 102, 103, and 104 the data lines are arranged in a folded manner. The data lines are consecutively arranged in the following order: $0, 2^n-1, 1, 2^n-2, 2, \ldots 2^{n-1}+2, 2^{n-1}-2, 2^{n-1}+1, 2^{-1}-1, 2^{n-1}$. In other words, the first half of the data lines of a sub-block are arranged from bottom to top consecutively on even spaces leaving odd spaces for one data line between each consecutive data line. These odd spaces are then filled with the data lines of the second half consecutively from top to bottom. Thus, the length of the lines interconnecting the decoder and multiplexers and therefore their respective line capacity are minimized. In addition, column multiplexer 105 receives the necessary address signals at terminal 106 to switch between the sub-blocks 101, 102, 103, and 104. The output of memory block 100 can be accessed at terminal 180. The decoder enable signal of the last word decoder $2^n-1$ is also coupled with a multiplexer for the first data line 0. This is done, because in case of an unaligned selection of the last data line in a sub-block the next data line 0 of the next sub-block might have to be selected. This is done by also coupling this decoder enable signal and the select signal to the column multiplexer 105. Column multiplexer switches to the next column in case both signals are set to "1".

Figure 3B:
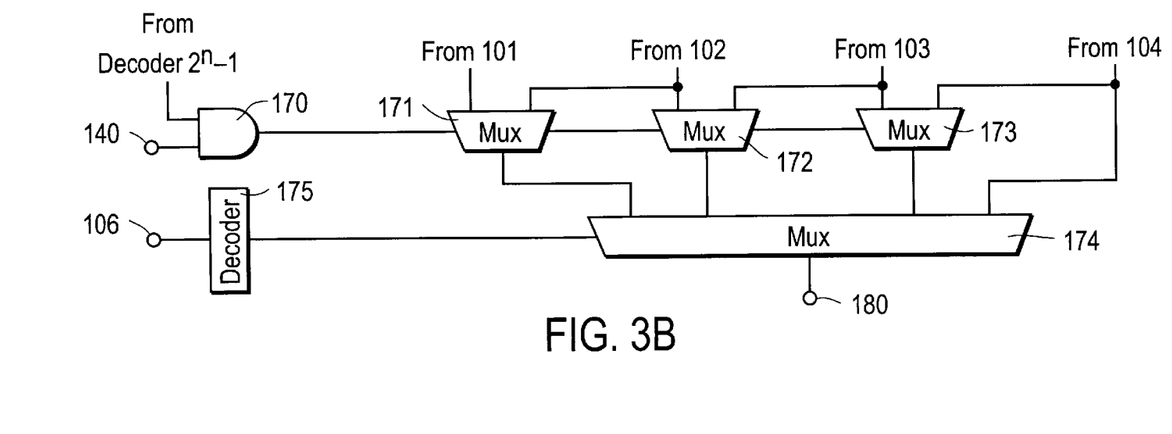
FIG. 3B shows an embodiment of a column multiplexer according to FIG. 3A.

FIG. 3B shows the column multiplexer for selecting a memory sub-block in more detail. The select signal 140 from select logic unit 400 is combined with the enable signal from the decoder for data line $2^n-1$ by means of an AND gate 170. Instead of the enable signal for data line $2^n-1$, an AND gate can be used which decodes the access to data line $2^n-1$ by looking at the address. The output of AND gate 170 controls multiplexers 171, 172, and 173. Each multiplexer 171, 172, and 173 receives the output signal from one sub-block and from next adjacent sub-block. Thus, multiplexer 171 receives the output signal from sub-block 101 and 102, multiplexer 172 from sub-block 102 and 103, and multiplexer 173 from sub-block 103 and 104. Multiplexer 174 selects one of the output lines of multiplexers 171, 172, 173, or the output line of the last sub-block 104.

Figure 4:
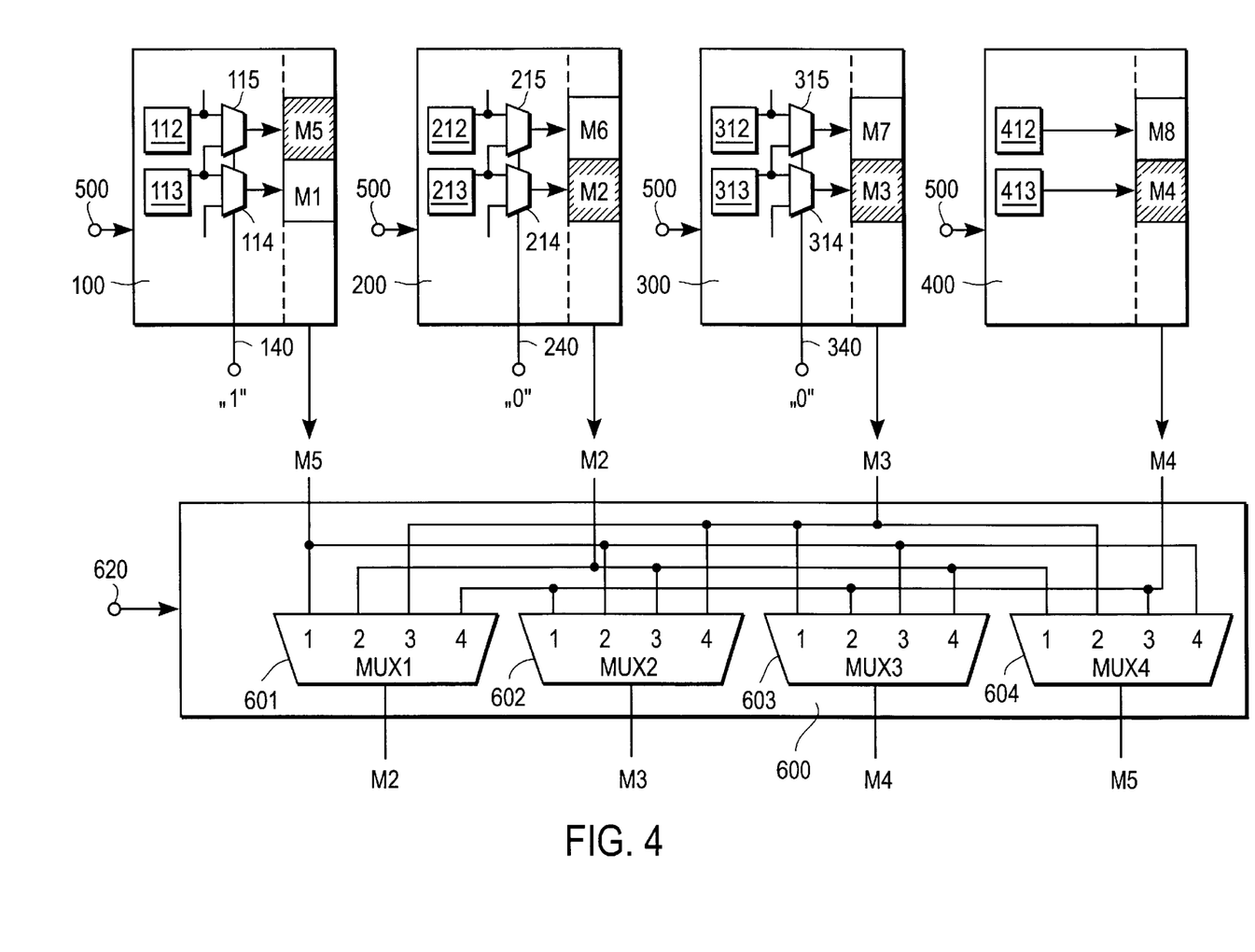
FIG.4 shows an example of an unaligned access with a memory unit according to the present invention.

FIG. 4 shows a typical unaligned access to the memory and how the selected data lines are transferred to the output of the memory system. For a better overview FIG. 4 uses a consecutive arrangement of the data lines and not the optimized layout of FIG. 3. Also, only two consecutive data lines for each memory block are shown, whereby those data lines are arranged in an order from bottom to top. The aligner 600 comprises four multiplexers 601, 602, 603, and 604. Each multiplexer has four 32-bit inputs and one 32-bit output. The multiplexers are controlled individually by a control signal 620 which selects one of the four inputs 1, 2, 3, or 4 for each multiplexer 601, 602, 603, and 604. Control signal 620 can consist of multiple signals, such as 2 signals to select the four different inputs. The output of memory block 100 is coupled with input 1 of multiplexer 601, input 2 of multiplexer 602, input 3 of multiplexer 603, and input 4 of multiplexer 604. The output of memory block 200 is coupled with input 2 of multiplexer 601, input 3 of multiplexer 602, input 4 of multiplexer 603, and input 1 of multiplexer 604. The output of memory block 300 is coupled with input 3 of multiplexer 601, input 4 of multiplexer 602, input 1 of multiplexer 603, and input 2 of multiplexer 604. The output of memory block 400 is coupled with input 4 of multiplexer 601, input 1 of multiplexer 602, input 2 of multiplexer 603, and input 3 of multiplexer 604. Memory blocks 100, 200, and 300 are designed according to the present invention allowing access to either the addressed data line or the data line with the address incremented by "1". Memory block 400 can be a standard memory and does not need to allow access to the "incremented" data line as will be explained later.

Assuming an unaligned access to the memory addresses the 128-bit word consisting of the content of data lines M2, M3, M4, and M5 the following scenario takes place. All necessary address signals, for example, all address lines excluding the least significant four bits in case of byte addressing, are supplied to the memory blocks 100, 200, 300, and 400. In case of a word addressing the least 2 significant bits are excluded. Thus, the output of decoders 113, 213, 313, and 413 will be enabled. Select logic unit 400 will generate the select signals 140, 240, 340 for the multiplexers of memory blocks 100, 200, and 300. Select line 140 will carry a "1" and select lines 240 and 340 will carry a "0". Thus, decoder 213 will enable data line M2 in block 200, decoder 313 will enable data line M3 in block 300, and the enable signal from decoder 113 will be re-directed through multiplexer 115 to enable data line M5. Multiplexer 601 of aligner 601 is controlled to select input 2, multiplexer 602 is controlled to select input 3, multiplexer 603 is controlled to select input 4, and multiplexer 604 is controlled to select input 1. Thus, the output of aligner 600 carries the now aligned 128-bit data word M2, M3, M4, M5.

Figure 5:
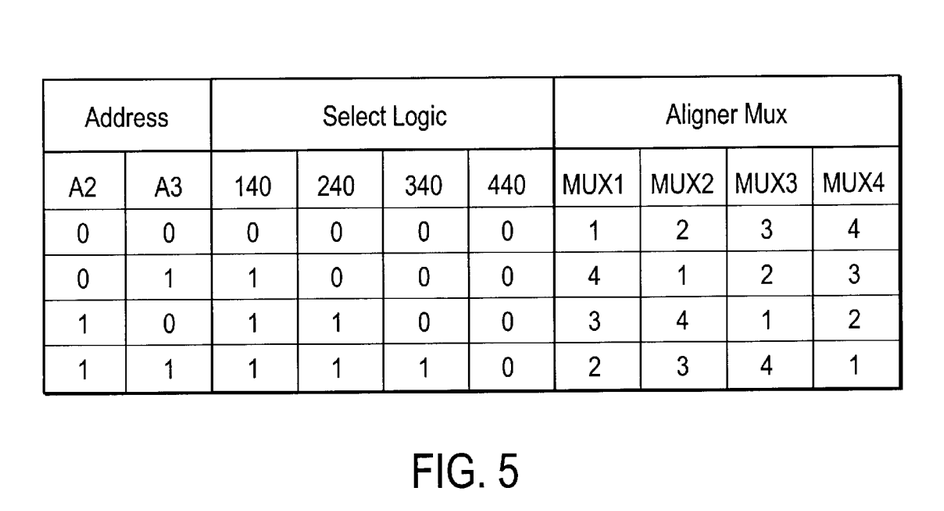
FIG. 5 shows a table depicting the different signals generated by the select logic unit.
Figure 6:
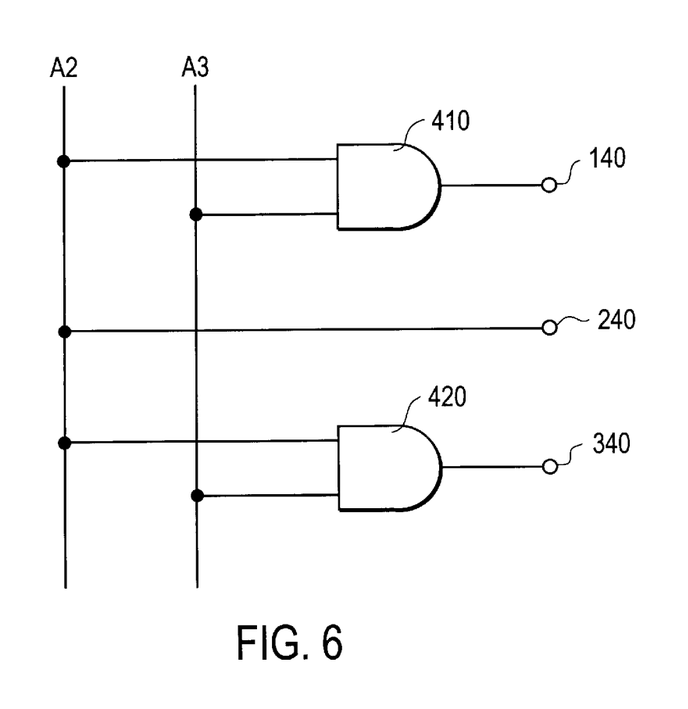
FIG. 6 shows an embodiment of the select unit 400.

FIG. 5 shows a table with the different select signals and with the control signals for the multiplexers of aligner 600. The select signals can easily be generated from the lower address signals A2, and A3. As in this embodiment the minimum word size is 32 bit and byte addressing is used, the least significant address lines A0 and A1 are not used for load/store commands. As can be seen select line 440 always carries "0". Due to the organization of the memory this block will never be addressed to output a data line with an address incremented by "1". Therefore, memory block 400 does not have to be designed according to the present invention and can be a standard memory block. FIG. 6 shows an embodiment for the select logic unit 400. An OR gate 410 receives address signals A2 and A3 and generates select signal 140 at its output. A2 is directly used to generate select signal 240. A AND gate 420 is provided whose inputs are coupled with address signals A2 and A3 to generate select signal 340 at its output.

Figure 7:
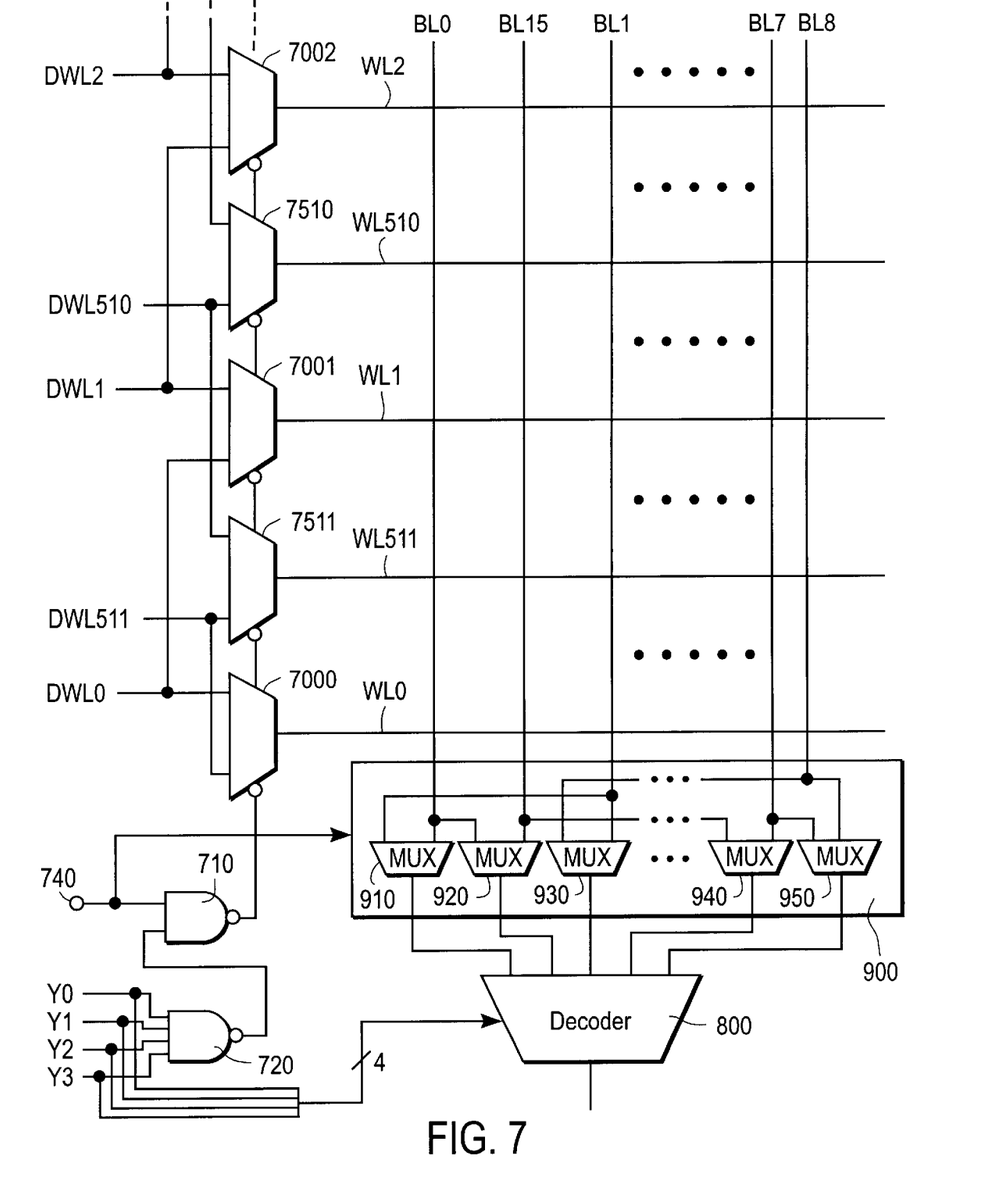
FIG. 7 shows a block diagram of another embodiment according to the present invention.

FIG. 7 shows another embodiment according to the present invention having a different organization. A standard memory, such as a dynamic or static memory, is organized through word lines WL0, . . . WL511 and bit lines BL0, . . . BL15 which form a matrix. Each cross point of these bit lines and word lines define a memory cell. Thus, for example, a memory block according to the FIG. 7 contains 512×16=8 k memory cells, or 1 kByte. Word lines WL0, . . . WL511 are organized according to the scheme explained with respect to FIG. 3A. Thus, the order from bottom to top is WL0, WL511, WL1, WL510, WL2, . . . The bit lines are arranged in a similar way from left to right. Thus, the order is BL0, BL15, BL1 BL14, . . . BL7, BL8. This arrangement allows the possibility of single bit access as opposed to a byte/word access in the embodiments described above. To access a word a plurality of those memory blocks are accessed in parallel.

Each word line has one associated multiplexer 7000, 7001, 7002, . . . 7511. The decoder (not shown) for each word line generates enable signals DWL0, DWL1, . . . DWL511. Each enable signal DWL0, DWL1, . . . DWL511 is fed to its associated multiplexer 7000, 7001, . . . 7511 and to the multiplexer of the next higher addressed word line. The enable signal of the last decoder 7511 is fed with the second input of multiplexer 7000. A NAND gate 710 receives the select signal 740 from a select logic unit (not shown) which determines whether the addressed memory cell or the memory ell with an address incremented by "1" is selected. The output of NAND gate 710 controls all multiplexer 7000, . . . 7511 whose control inputs provide an inverted logic. Another NAND gate 720 with four inputs and an output is provided. The inputs are coupled with address signals Y0, Y1, Y2, and Y3. The output is coupled with the second input of NAND gate 710. A decoder 800 and multiplexer unit 900 are provided. Multiplexer unit 900 is coupled with all bit lines BL0, BL1, . . . BL15 to receive the output of the respective addressed memory cells. Multiplexer unit 900 comprises a 2×1 multiplexer for each bit line BL0, BL1, . . . BL15. BL0 is coupled with one input of multiplexer 910 and one input of a multiplexer 920. The other input of multiplexer 910 is coupled with BL1. Multiplexer 930 is coupled with bit lines BL1 and BL2, the multiplexer associated with bit line BL2 is coupled with BL2 and BL3. All other multiplexers are coupled with the respective bit lines in a similar way. Thus, BL 15 is coupled with one input of multiplexer 920 and with one input of the multiplexer associated with bit line BL14. Multiplexer 900 receives select signal 740 as a control signal to control the multiplexers 910, 920, 930, 940, . . . Address signals Y0, Y1, Y2, and Y3 control decoder 800 to select one of the outputs of multiplexer unit 900.

The structure shown in FIG. 7 allows accessing the content of an address and of the address incremented by "1" depending on the select signal 740. In this architecture the LSB of the address will correspond to the bit-lines and the MSB to the word-lines. In an arrangement according to FIG. 7 there are 16 bit-lines and 512 word lines. Thus the LSB would comprise four address lines and the MSB nine address lines. It has to be differentiated between three major cases. In a first scenario, the LSB address portion <15 and the MSB address portion <511. Thus the address incremented by "1" is selectable through the bit-line multiplexer 910, 920, 930, 940, . . . In a second scenario, the LSB address portion=15 and the MSB address portion <511. In this scenario, either BL15 or BL0 is selected through multiplexers 910 or 920, respectively. In addition NAND gate 720 decodes the LSB address as "1111" and therefore selects the next word line through multiplexers 7000, . . . 7511. In a third scenario, both LSB and MSB are set to their maximum value of 15 and 511, respectively. In this scenario the arrangement according to FIG. 7 wraps around to LSB address portion 0 and MSB address portion 0. This is particularly useful for implementations of circular buffers. Of course, this special address situation can also be used to generate another control signal which can be used to control another multiplexer to select a further memory block.

Figure 8:
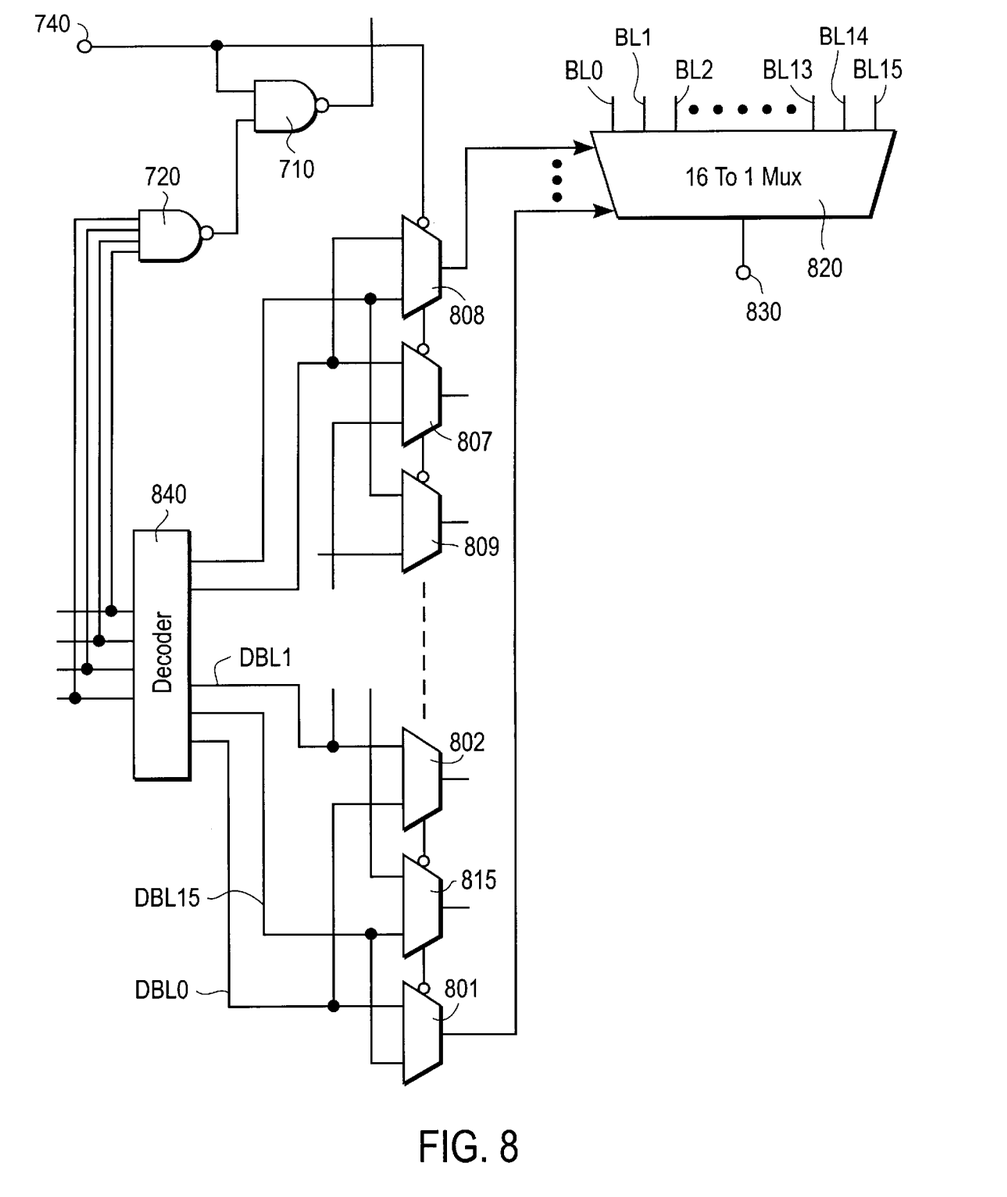
FIG. 8 shows a block diagram of yet another embodiment according to he present invention.

FIG. 8 shows another embodiment of a bit addressable memory block. The multiplexer arrangement is here used to select the enable signals for the bit lines rather than selecting the bit lines directly. Thus, the bit lines do not have to be arranged in a folded manner as described above and can be in any order, for example consecutively. A decoder 840 is provided which receives the, for example the four address signals Y0,Y1, Y2, and Y3. Post-decoder 840 generates 16 enable signals DBL0, . . . DBL15. 16 multiplexers 801, . . . 816 are provided for each bit line BL0, . . . BL15. The enable signals DBL0, . . . DBL15 are enabling the respective bit lines BL0, . . . BL15 in a similar manner as the enable signals for the word lines using a plurality of multiplexers 801, . . . 816. Thus, enable signal DBL0 is fed to multiplexer 801 and 802, enable signal DBL1 is fed to multiplexer 802 and 803, etc. The enable signal DBL15 is fed to the last multiplexer 815 and to multiplexer 801. The select signal 740 controls directly all multiplexers 801, . . . 816. The output of multiplexers 801, . . . 816 control a 16 to 1 multiplexer 820 which receives the output of each bit line BL0, . . . BL15. The output 830 of multiplexer 820 forms the output of the memory block. The arrangement of the multiplexers for the word lines is not shown in FIG. 8 and is identical to the arrangement shown in FIG. 7.

The embodiment shown in FIG. 8 works in the same manner as the embodiment shown in FIG. 7. Instead of selecting a single bit line directly, the enabling signal is switched through multiplexers 801, 802, . . . 815 in a way that either the addressed bit line is selected or the bit line with an incremented address. The specific arrangement of the bit-lines and the word-lines in a folded manner as shown in FIGS. 7 and 8 reduces the length of the control lines between the multiplexers to a minimum and therefore allows maximum access speed to all memory cells and a minimum load for the respective drivers. Furthermore, the silicon area is reduced to a minimum with an arrangement according to the present invention.

The present invention can be easily adapted to different memory architectures with different organizations to allow unaligned access to multiple words. The concept of selecting the decoded data line or the "next higher" data line can be applied to static random access memories SRAMs or dynamic random access memories DRAMs or any other type of similar organized memories. Throughout the description the present invention is described for loading data from the memory. Of course, even so throughout the description only the reading paths are described, writing to the memory is done in the same way according to the present invention and can be easily adapted by someone skilled in the art.

We claim:

1. Integrated memory block comprising a plurality of data lines and a plurality of decoders associated to each data line, whereby each decoder decodes an associated address and generates an enable signal, a plurality of multiplexers for rerouting said enable signal to either said associated data line or to the next higher data line.

2. Integrated memory block according to claim 1, wherein each multiplexer comprises two controllable drivers, each having an input and an output, wherein said outputs of said drivers are interconnected and provide a data line select signal and wherein said inputs receive said enable signals from said decoders.

3. Integrated memory block according to claim 1, wherein said memory comprises at least one memory sub-block, said memory sub-block comprises $2^n$ word lines, whereby a first half of said data lines are arranged consecutively from a bottom position to a top position whereby each two consecutive data lines, are spaced apart to allow a placement of a further data line in between each two consecutive data lines, and whereby a second half of said data lines are arranged consecutively from said top position to said bottom position in said in between spaces.

4. Integrated memory block according to claim 1, wherein the multiplexer associated with the first data line receives the enable signal of the decoder for the last data line.

* * * * *